(12) United States Patent
Hsieh

(10) Patent No.: US 7,548,422 B2
(45) Date of Patent: Jun. 16, 2009

(54) SOCKET HAVING FAN

(75) Inventor: Wayne Hsieh, Tu-Cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 122 days.

(21) Appl. No.: 11/890,859

(22) Filed: Aug. 8, 2007

(65) Prior Publication Data

US 2008/0037220 A1 Feb. 14, 2008

(30) Foreign Application Priority Data

Aug. 8, 2006 (TW) .............................. 95213899 U

(51) Int. Cl.
*H05K 7/20* (2006.01)
*H01R 13/62* (2006.01)

(52) U.S. Cl. .................. 361/695; 361/697; 165/104.33; 165/121; 439/710; 439/73; 439/330

(58) Field of Classification Search ................. 361/687, 361/690–697, 704–712, 717–722; 165/80.2, 165/80.3, 104.33, 104.34, 121, 185; 257/706–727; 174/15.1, 16.3, 252; 439/70–73, 330–331, 439/266, 525, 337
See application file for complete search history.

(56) References Cited

U.S. PATENT DOCUMENTS

| | | | |
|---|---|---|---|
| 6,086,387 A * | 7/2000 | Gallagher et al. | 439/71 |
| 6,236,569 B1 * | 5/2001 | McEuen | 361/719 |
| 6,504,392 B2 * | 1/2003 | Fredeman et al. | 324/760 |
| 6,547,580 B1 * | 4/2003 | Leavitt et al. | 439/266 |
| 6,570,398 B2 * | 5/2003 | Murphy et al. | 324/755 |
| 6,648,664 B1 * | 11/2003 | McHugh et al. | 439/331 |
| 6,735,085 B2 * | 5/2004 | McHugh et al. | 361/719 |
| 7,030,638 B2 * | 4/2006 | Stutzman | 324/765 |
| 7,182,619 B2 * | 2/2007 | Hsu | 439/331 |
| 7,338,308 B2 * | 3/2008 | Nakao et al. | 439/331 |
| 7,387,523 B2 * | 6/2008 | Hsu | 439/331 |

* cited by examiner

Primary Examiner—Michael V Datskovskiy
(74) Attorney, Agent, or Firm—Wei Te Chung

(57) ABSTRACT

A socket for a semiconductor package comprises an insulating base containing a plurality of contacts, a floating board received in the insulating base, a plurality of spring members located between the insulating base and the floating board, a bottom cover pivotally assembled to an end of the insulating base, a top cover pivotally assembled to an edge of the bottom cover, a pressing board retained to the bottom cover, a heat sink module disposed on the bottom cover, and a fan mounted on the top cover.

13 Claims, 2 Drawing Sheets

US 7,548,422 B2

SOCKET HAVING FAN

BACKGROUND OF THE INVENTION

1. Field of the Invention

The present invention relates to a socket, which is connected to a semiconductor package.

2. Description of the Related Art

Semiconductor packages, such as integrated circuits (ICs), are miniaturized electronic devices in which a number of active and passive circuit elements are located on or within a continuous body of material to perform the function of a complete circuit. Sometimes, a socket is needed to receive a semiconductor package therein and electrically connect the semiconductor package with a circuit board.

A conventional socket usually has an insulating base receiving a plurality of contacts, a floating board assembled to the insulating base and being able to shift from a conducting position to a disconnection position relative to the insulating base, a spring member located between the insulating base and the floating board to urge the floating board to move from the conducting position to the disconnection position, a bottom cover pivotally assembled to an end of the insulating base, a top cover pivotally assembled to the bottom cover, and a pressing board mounted to the bottom cover by pivots.

In using, the top cover and the bottom cover of the socket are mounted to a print circuit board and initially locate at an opening position; a semiconductor package (not shown) is set on the floating board, at this state, the semiconductor package does not conduct with the print circuit board. Then, the bottom cover are actuate and bring the pressing board to rotate relative to the insulating base and to press the semiconductor package on the floating board, so that the semiconductor package and the floating board move downwardly, together, and a top surface of the semiconductor package abut against the pressing board, a plurality of contacting portions of the contacts upwardly pass through the floating board and electrically contact with the semiconductor package. Finally, the top cover rotates to cover the bottom cover and fix with the insulating base by a retainer, and then the semiconductor package is retained to the insulating base by the top cover to keep the semiconductor package electrically contacting with the print circuit board.

The semiconductor package brings an abundant of heats during testing, that will shorten a lift of the semiconductor package, even destroy the semiconductor package. So, a heat sink module is need to be mounted on the bottom cover to effectively scatter the heats, usually a fan is added and directly positioned upon the heat sink. However, more and more semiconductor packages with big powers are widely used in electrical equipments, to adapt to these semiconductor packages, fans need to become more higher to obtain more higher powers, and then the fan may easily interfere with the top cover of the socket during assembling and disassembling the fan to the socket.

SUMMARY OF THE INVENTION

An object of the invention is to provide a socket which can avoid the fan interfere with a top cover of the socket.

To achieve the above-mentioned object, a socket comprises an insulating base receiving a plurality of contacts and defining a receiving space; a bottom cover pivotally assembled to the insulating base; and a top cover pivotally assembled to the bottom cover and covering the bottom cover, the top cover having supporting portions upwardly protruding from sides thereof.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
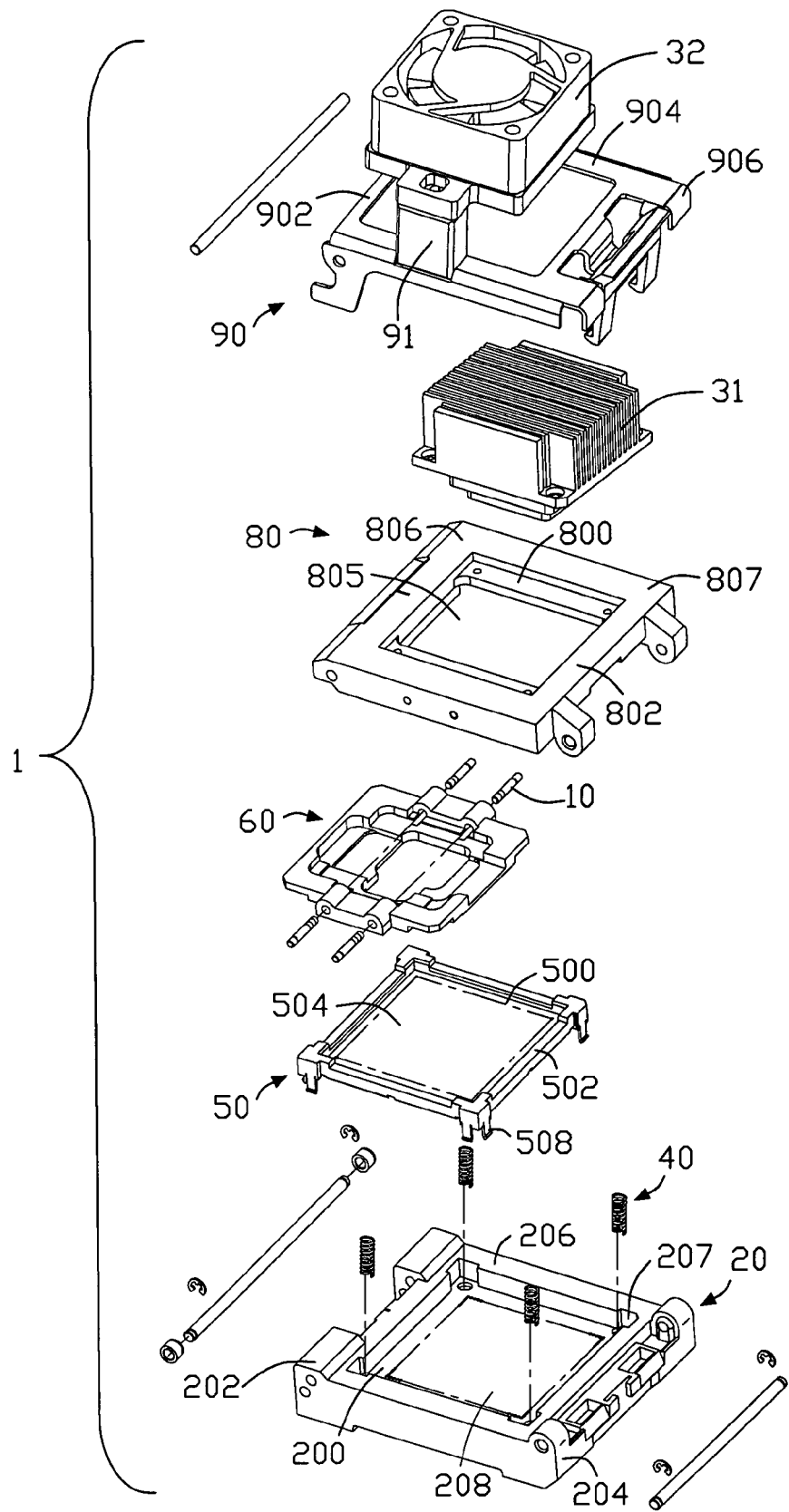
FIG. 1 is an exploded, perspective view of a socket in accordance with a preferred embodiment of the present invention.
Figure 2:
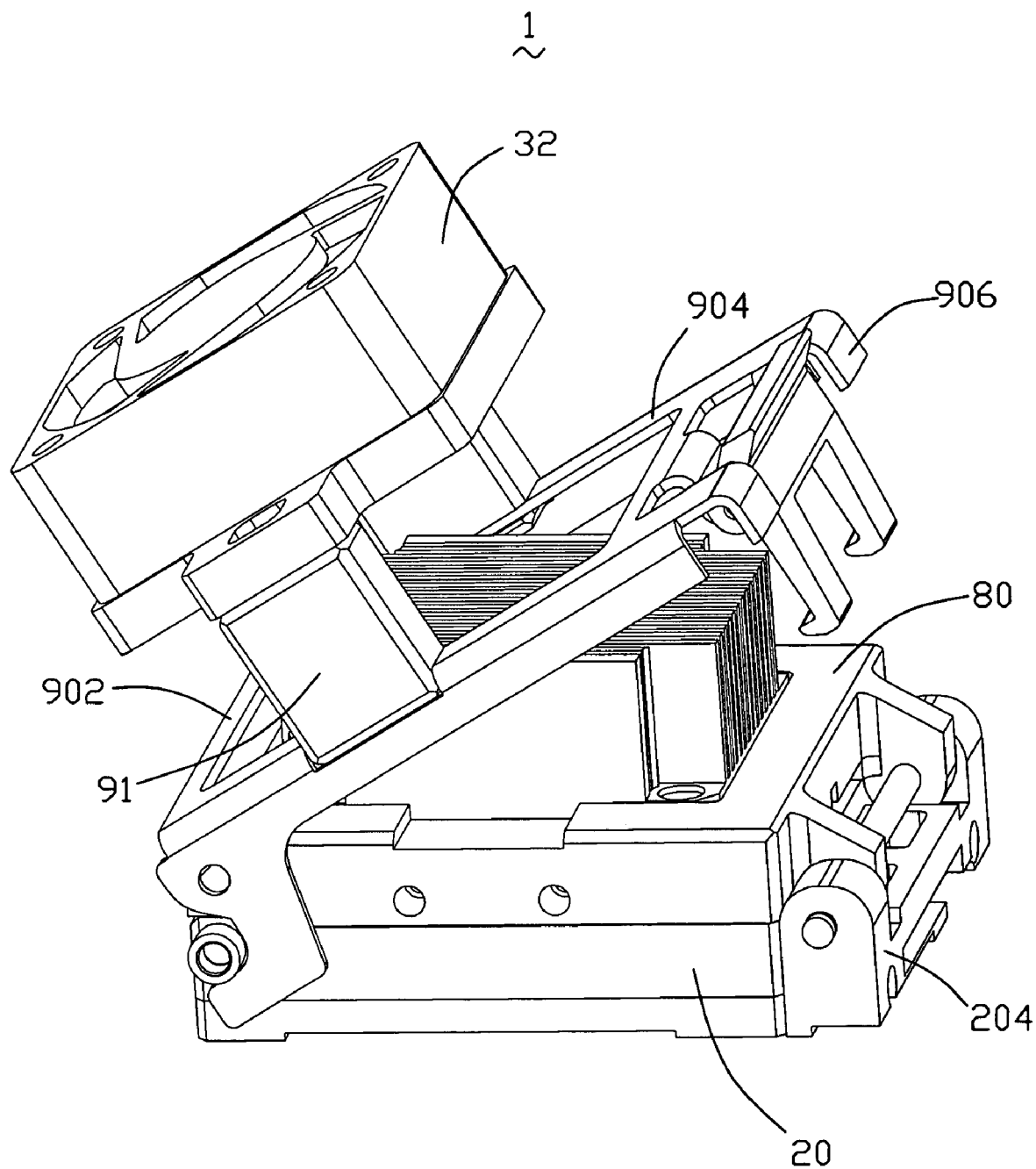
FIG. 2 is an assembled, perspective view of the socket in accordance with a preferred embodiment of the present invention.

Referring to FIGS. 1-2, a socket 1 in accordance with the preferred embodiment of the present invention is adapted to electrically connect a semiconductor package (not shown) to a circuit board (not shown). The socket 1 comprises an insulating base 20 containing a plurality of contacts (not shown), a floating board 50 assembled on the insulating base 20, a plurality of spring members 40, a bottom cover 80 pivotally assembled to an end of the insulating base 20, a top cover 90 pivotally assembled to an end of the bottom cover 80, a pressing board 60 retained to the bottom cover 80 by a plurality of retaining pivots 10, a heat sink module 31 disposed on the bottom cover 80, and a fan 32 mounted on the top cover 90.

The insulating base 20 is substantially rectangular shape and comprises a bottom wall 200, a pivot wall 202 and a retaining wall 204 respectively extending from opposed ends of the bottom wall 200, and a pair of linking walls 206 linking the pivot wall 202 and the retaining walls 204. These walls 200, 202, 204, 206 define a receiving space 208 together for accommodating the spring members 40 and the floating board 50. The bottom wall 20 defines a plurality of through passages (not shown), which are arranged in matrix to receive the contacts. Each contact has an end extending downwardly from the bottom wall of the insulating base 20 to electrically connect with the conduct pad in the circuit board (not shown), and another end upwardly extending into the receiving space 208 with a contacting portion at the top thereof to contact with the semiconductor package. The insulating base 20 defines a plurality of recesses 207 for receiving the floating board 50 at four corners thereof.

The floating board 50 is a board-like configure, the floating board is set in the receiving space 208 of the insulating base 20 and defines a conducting position and a disconnection position relative to the insulating base 20. The floating board 50 comprises a supporting wall 500 and a plurality of sidewalls 502 extending from the supporting wall 500 and together defining a room 504 for the semiconductor package. The floating board 50 has a plurality of locking claws 508 at four corners thereof to engage with corresponding recesses 207 of the insulating base 20, so the floating board 50 is able to movably assembled to the insulating base 20. The spring members 40, such as springs, are disposed between the floating board 50 and the bottom wall 200 of the insulating base 20 to force the floating board 50 from the conducting position to the disconnection position. The spring members 40 are located between the insulating base 20 and the floating board 50 and being used for urging the floating board 50 to move from the conducting position to the disconnection position The bottom cover 80 is a frame with a hollow in a center thereof and comprise a pivot edge 802 pivotally assembled to the insulating base 20, a mounting edge opposed to the pivot edge 806, two linking edges 807 linking the pivot edge 802 and the pivot edge 806. Said edges 802, 806, 807 define an opening 805 in a center of the bottom cover 80, the bottom cover 80 is formed with a loading portion 800 surround the opening 805 to support the heat sink module 31 on there, the linking edges 807 defines a plurality of holes for receiving the retaining pivots 10. The top cover 90 is stamped from a metal piece and covers out sides of the bottom cover 80, the top cover 90 defines a mouth (not labeled) and four sides surround the mouth, these edges comprise a pivot side 902, a retaining side 906 opposed to the pivot side 902, a pair of pressing sides 904 linking the pivot side 902 and the retaining side 906. The pressing side 904 has a supporting portion 91 upwardly protruding from a center thereof to retain the fan 32. A bottom seat 320 is provide by the fan 32 and is mounted to the supporting post 91 to retain the fan 32 with the top cover 90.

The pressing board 60 has a board-like shape with a center opening, and can be detachably assembled to the bottom cover 80 by the retaining pivots 10. The pressing board 60 can be replaced according as a shape and a size of the semiconductor package. The retaining pivot 10 horizontally passes through corresponding holes defined on the pressing board 60 and the bottom cover 80 to retain the pressing board 60 to the bottom cover 80.

Continuing referring to FIGS. 1-2, when assembly, the floating bard 50 is placed in the receiving space 208 of the insulating base 20, the spring members 40 are located between the floating board 50 and the insulating base 20, the locking claws 508 of the floating board 50 latch with the inner side surfaces of the insulating base 20; and then the pressing board 60 is assembled to the bottom cover 80 by the retaining pivots 10, and the heat sink module 31 is assembled to the bottom cover 80 from top to bottom the bottom, after that, the bottom cover 80, together with the floating board 60 and the heat sink module 31, is pivotally retained to the retaining wall 204 of the insulating base 20; finally, the top cover 90, together with the fan 32, is linked to the pivot edge 806 of the bottom cover 80 and rotatablely move from an opening position to a close position relative to the bottom cover 80.

In using, the top cover 90 and the bottom cover 80 is at the opening position initially, the semiconductor is put on the floating board 50, at this moment, the floating board 50 is at the disconnection position, where the contacting portions of the contacts are not beyond the floating board 50. Then, the bottom cover 80 together with the pressing board 60 are actuated to rotate relative to the insulating base 20, and the pressing board 60 force the semiconductor package and the floating board 50 downwardly move till the floating board 50 arrive the conducting position, where the contacts are through the floating board 50 and electrically contact with the semiconductor package, finally, by the top cover 90 rotate downwardly to lock with the insulating base 20 by a retainer 30. So the semiconductor package can reliably and firmly connect with the circuit board by the contacts.

The socket 1 in the embodiment changes a mounting position of the fan to solve the problem when the fan is too high, the fan and the top cover may interfere each other during assembling or detaching the socket, so a fan with big power can be used easily in the socket. And a height of the protruding post for retaining the fan on the top cover may be changed to adapt for the height of the fan.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket comprising:
    an insulating base receiving a plurality of contacts and defining a receiving space;
    a bottom cover pivotally assembled to the insulating base; and
    a top cover pivotally assembled to the bottom cover and covering the bottom cover, the top cover having supporting portions upwardly protruding from sides thereof.

2. The socket of claim 1, further comprising a fan mounted to and supported by the supporting portions of the top cover.

3. The socket of claim 1, further comprising a floating board movably received in the receiving space of the insulating base and a plurality of spring members located between the insulating base and the floating board to upwardly urge the floating board.

4. The socket of claim 3, further comprising a pressing board retained in an opening defined in a center of the bottom cover and a heat sink module located upon the bottom cover and upwardly passing through a mouth defined on the top cover.

5. A socket for a semiconductor package comprising:
    an insulating base receiving a plurality of contacts and defining a receiving space;
    a bottom cover pivotally assembled to an end of the insulating base thereof;
    a top cover pivotally assembled to an edge of the bottom cover and covering the bottom cover; and
    a fan mounted on the top cover.

6. The socket of claim 5, wherein the top cover is formed with supporting portions protruding upwardly from opposed sides thereof, the fan is mounted to and retained with the supporting portions.

7. The socket of claim 6, wherein the top cover is formed with a pivot sides attached to the bottom cover and a retaining side opposed to the pivot side, to which a retainer is assembled for retaining the top cover to the insulating base.

8. The socket of claim 6, further comprising a floating board movably received in the receiving space of the insulating base and a plurality of spring members located between the insulating base and the floating board to upwardly urge the floating board.

9. The socket of claim 8, further comprising a pressing board retained in an opening defined in a center of the bottom cover and a heat sink module mounted on the bottom cover.

10. The socket of claim 9, wherein the top cover has a mouth for the heat sink module passing through, and the supporting portion has a certain height to let the fan locate upon the heat sink.

11. The socket of claim 9, wherein the floating board defines a room for receiving the semiconductor package, the pressing board can downwardly press the semiconductor package to bring the floating board and the semiconductor package downwardly move.

12. A socket assembly comprising:
    an insulating base receiving a plurality of contacts and defining a receiving space;
    a bottom cover having one end linked to an end of the insulating base thereof;
    a top cover linked to the other end of the bottom cover and covering the bottom cover; and a fan mounted on the top cover with a distance so as to allow a heat sink to be located thereunder under a condition that both the top cover and the bottom cover respectively define aligned central openings through which said heat sink and an associated electronic package extend.

13. The socket assembly as claimed in claim 12, wherein at least one supporting section is formed on the top cover unto which the fan is assembled.

* * * * *